(12) United States Patent
Grossman et al.

(10) Patent No.: US 9,276,612 B2
(45) Date of Patent: Mar. 1, 2016

(54) REED-SOLOMON ERASURE DECODING WITH ERROR DETECTION FOR RETRANSMISSION

(71) Applicant: TQ DELTA, LLC, Austin, TX (US)

(72) Inventors: Joshua Grossman, Gardner, MA (US); John A. Greszczuk, Stow, MA (US); Marcos C. Tzannes, Alamo, CA (US)

(73) Assignee: TQ DELTA, LLC, Austin, TX (US)

( * ) Notice: Subject to any disclaimer, the term of this patent is extended or adjusted under 35 U.S.C. 154(b) by 0 days.

(21) Appl. No.: 14/328,237

(22) Filed: Jul. 10, 2014

(65) Prior Publication Data

US 2014/0325306 A1 Oct. 30, 2014

Related U.S. Application Data

(63) Continuation of application No. 13/322,170, filed as application No. PCT/US2010/037195 on Jun. 3, 2010, now Pat. No. 8,782,498.

(60) Provisional application No. 61/183,845, filed on Jun. 3, 2009.

(51) Int. Cl.
*H04L 1/18* (2006.01)
*H03M 13/13* (2006.01)
*H03M 13/15* (2006.01)
*H03M 13/37* (2006.01)
*H03M 13/00* (2006.01)
*H04L 1/00* (2006.01)
*H04L 1/20* (2006.01)

(52) U.S. Cl.
CPC .......... *H03M 13/13* (2013.01); *H03M 13/1515* (2013.01); *H03M 13/373* (2013.01); *H03M 13/6306* (2013.01); *H04L 1/0045* (2013.01); *H04L 1/0057* (2013.01); *H04L 1/189* (2013.01); *H04L 1/1816* (2013.01); *H04L 1/1829* (2013.01); *H04L 1/201* (2013.01)

(58) Field of Classification Search
CPC .... H04L 1/1812; H04L 1/1809; H04L 1/1819
USPC ................................................. 714/748–751
See application file for complete search history.

(56) References Cited

U.S. PATENT DOCUMENTS

| 4,395,768 A | 7/1983 | Goethals et al. |
| 5,699,369 A * | 12/1997 | Guha .......................... 714/774 |
| 6,438,723 B1 * | 8/2002 | Kalliojarvi .................. 714/751 |

(Continued)

OTHER PUBLICATIONS

Ghani et al., NEw results on the performance of reed-solomon codes in wireless data networks, 1999, IEEE, pp. 1480-1484.*

(Continued)

*Primary Examiner* — Shelly A Chase
(74) *Attorney, Agent, or Firm* — Jason H. Vick; Sheridan Ross, PC (57) ABSTRACT

By utilizing Reed-Solomon erasure decoding algorithms and techniques, the system is able to perform error detection for the case where the number of bytes received in error exceeds a correcting capability of a decoder. The error detection can be used, for example, to determine whether a codeword is decodable, and whether the retransmission of data is necessary. The retransmission can be accomplished by assembling a message that is sent to another modem requesting retransmission of one or more portions of data, such as one or more codewords.

8 Claims, 7 Drawing Sheets

(56) References Cited

U.S. PATENT DOCUMENTS

| | | |
|---|---|---|
| 7,103,096 B2 * | 9/2006 | Mitlin et al. .................. 714/748 |
| 7,573,860 B2 * | 8/2009 | Zhao et al. .................... 370/342 |
| 8,015,475 B2 | 9/2011 | Lu et al. |
| 8,418,037 B2 | 4/2013 | Li et al. |
| 8,481,037 B2 | 7/2013 | Reed et al. |
| 8,782,498 B2 | 7/2014 | Grossman et al. |
| 2002/0029362 A1 | 3/2002 | Stephen et al. |
| 2004/0042566 A1 | 3/2004 | Eidson et al. |
| 2005/0286566 A1 | 12/2005 | Tong et al. |
| 2008/0065968 A1 | 3/2008 | Jain et al. |

OTHER PUBLICATIONS

ITU-T Recommendation G.997.1, "Physical layer management for digital subscriber line (DSL) transceivers," International Telecommunication Union, Apr. 2009, 128 pages.
International Search Report and Written Opinion for International (PCT) Patent Application No. PCT/US2010/037195, Nov. 2, 2010.
International Preliminary Report on Patentability for International (PCT) Patent Application No. PCT/US2010/037195, mailed Dec. 15, 2011.
Official Action for U.S. Appl. No. 13/322,170, mailed Sep. 23, 2013.
Notice of Allowance for U.S. Appl. No. 13/322,170, mailed May 14, 2014.

* cited by examiner

REED-SOLOMON ERASURE DECODING WITH ERROR DETECTION FOR RETRANSMISSION

RELATED APPLICATION DATA

This application is a Continuation of U.S. patent application Ser. No. 13/322,170, filed Feb. 8, 2012, now U.S. Pat. No. 8,782,498, which is a National Stage Application under 35 U.S.C. 371 of PCT Application No. US2010/037195, having an international filing date of Jun. 3, 2010, which designated the United States, which PCT application claims the benefit of and priority under 35 U.S.C. §119(e) to U.S. Patent Application No. 61/183,845, filed Jun. 3, 2009, entitled "Reed-Solomon Erasure Decoding with Error Detection for Retransmission," which is incorporated herein by reference in its entirety.

FIELD OF THE INVENTION

An exemplary aspect of this invention relates to communications systems. More specifically, an exemplary aspect relates to error detection and packet retransmission in a communications network. Even more specifically, an exemplary aspect relates to Reed-Solomon erasure decoding with error detection for retransmission in a packet-based communications network.

BACKGROUND

In coding theory, Reed-Solomon (RS) codes are non-binary cyclic error-correcting codes invented by Irving S. Reed and Gustave Solomon. They described a systematic way of building codes that could detect and correct multiple random symbol errors. By adding T check symbols to the data, an RS code can detect any combination of up to T erroneous symbols, and correct up to [T/2] symbols. As an erasure code, it can correct up to T known erasures, or it can detect and correct combinations of errors and erasures. Furthermore, RS codes are suitable as multiple-burst bit-error correcting codes, since a sequence of b+1 consecutive bit errors can affect at most two symbols of size b. The choice of T is generally up to the designer of the code, and may be selected within wide limits.

SUMMARY

A first exemplary aspect is directed toward utilizing Reed-Solomon erasure decoding algorithms and techniques to perform error detection for the case where the number of bytes received in error exceeds a correcting capability of a decoder. The error detection can be used, for example, to determine whether a codeword is decodable, and whether the retransmission of data is necessary, and trigger the retransmission, if necessary.

In a communications system, such as a DSL or multicarrier modulation communication system, the output of a trellis decoder is typically deinterleaved by a convolutional interleaver before being decoded by the Reed-Solomon decoder. In such a system, the Viterbi Path-Metric information determined during trellis decoding can be used to determine the reliability of the received data and a reliability metric can be assigned or associated with one or more bytes in a codeword. For example, alternatively or in addition one or more bytes can be assigned a reliability metric based on one or more of a subcarrier signal-to-noise ratio, margin, noise measurement, channel conditions, or the like. In general, the reliability information is grouped such that L consecutive bytes at the output of the trellis decoder will have the same metric. By convention, the reliability information can be defined such that a metric with a low value indicates a byte that is likely to be errored.

This reliability information can then be propagated through the interleaver along with data to enable the use of erasures in the RS decoder. Rather than choosing a hard-coded erasure threshold, one exemplary embodiment computes multiple solutions for each codeword. The best decode is the one that minimizes an objective function that depends on the reliability of the bytes corrected in that solution. These solutions correspond to the different numbers of potential erasures, located at the S least reliability codeword locations, and T errors, whose location is determined by the decoder. The decoder can then find R/2+1 potential solutions, where R is the redundancy of the code, such that each solution has S+2T<R for T=0 . . . R/2.

In the above equation, if S is set to zero, then each solution has 2T<R potential erasures. Alternatively, if T is set to zero, then there are S<R potential erasures. Therefore, one exemplary embodiment tries multiple, or all, possibilities of S and/or T.

In accordance with one exemplary embodiment, the decoder operates on each RS codeword as follows:

1. Sort the reliability metrics for each byte and choose the R worst (e.g., most likely to be errored) bytes as potential erasures.

2. Determine the R/52+1 potential codewords that result from correcting all of the R worst bytes and no errors; the R−2 worst bytes and one error . . . on so on.

3. Score all R/2+1 solutions by summing the reliability metrics for each byte that was incorrect in that particular solution. The potential codeword with the lowest score is the best, e.g., the least likely to contain errors, and is the candidate solution.

4. If the candidate solution has a score less than a programmable "correctability" threshold, decode the codeword, otherwise declare the codeword uncorrectable and optionally assemble a message requesting retransmission thereof.

Another exemplary embodiment is directed toward the situation where impulse burst length is greater than an impulse noise protection (INP) value. For example, if there is a burst of consecutive errors at the input to the interleaver of size of L*M, where M is an integer, then almost all of the L*M bytes are in error and the reliability metric for each of the M blocks will likely be low. Therefore, because of the deinterleaver, the RS decoder can correct any burst of consecutive errors such that L*M<=R*D, where D is the depth of the interleaver.

There are then two cases: the first is where L*M<=R*D, and the second is where L*M>R*D. After deinterleaving, this yields the situation illustrated in FIG. 2 as input to the RS decoder, where in Case 1, the bytes are correctable and in Case 2, the bytes are not correctable.

Figure 2:
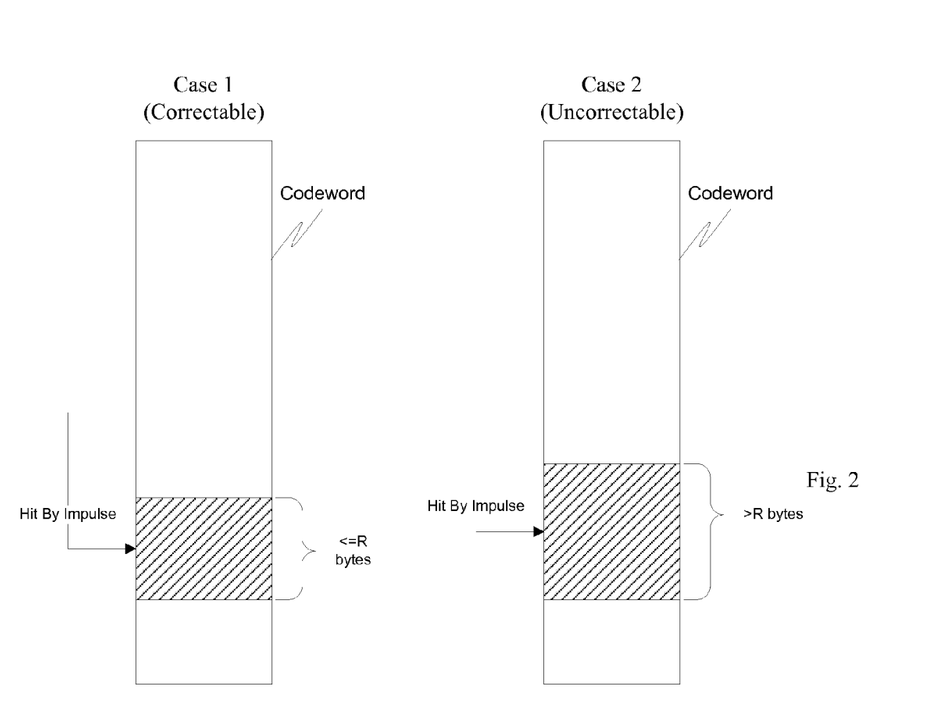
FIG. 2 illustrates two exemplary cases for correctable and uncorrectable codewords according to this invention.

More specifically, in Case 1, the codeword is correctable because the number of corrupted bytes is <=R. In Case 2, a codeword was hit by an error burst that was too long, leading to more than R bytes that must be corrected. In Case 1, all the errors should have a very low (bad) metric and because there are <=R of them, these errored bytes should be chosen as the potential erasures. Depending on exactly how many errored bytes there are, the decoder will chose one of the R/2+1 solutions that corrects that many bytes. The score for this solution will be roughly $E*Metric_{ERR}$ where E is the number of errors and $Metric_{ERR}$ is the average metric for the errored bytes.

For example, if R=16, there are 16 errors (the maximum correctable for this example) and the average metric for the errored bytes is 10, then the score for the winning codeword will be 160. If the correctability threshold is set higher than 160, the codeword will be corrected, if it is set less than 160, the decoder will declare the codeword uncorrectable.

In Case two, there are >R errored bytes, however the decoder is only capable of choosing R potential erasure locations so the decoder will chose an essentially random set of R potential erasures from the full set of >R actual errors. However, because any bad codeword can be transformed into a valid codeword by changing no more than R bytes, one potential solution that is guaranteed to exist is to correct all 16 of the worst bytes. In this example, if the average metric for the errored bytes is again 10, the score for the winning codeword will be no worse than 160. Even though this codeword will not be corrected properly, i.e., it will not be changed into the transmitted codeword, this is the same score as was obtained for the first case where the codeword was corrected properly. Thus, it is evident that no setting of the correctability threshold can distinguish between the two cases.

An exemplary solution that can distinguish between the two cases is to do the decode and scoring twice, once using the R worst bytes, and then again with a modified solution set obtained by swapping the $R^{th}$ and $R+1^{th}$ worst bytes. After doing that, if the decode for the alternate solution set does not have a score that is "sufficiently different" from the decode from the real, or first, solution set, then it may be more appropriate to ask for retransmissions.

The above would allow for the distinguishing between the two cases. In the first "correctable" case, the $R^{th}$ worst byte may have a metric of approximately 10, but the $R+1^{th}$ worst byte comes from a different block of L bytes so it will have a significantly higher metric, such as 100. As illustrated, the standard decode yields a score of 160. If the two bytes are swapped and the decoder decodes by again erasing all 16 potential erasures, the alternate codeword will have a metric of 250 (10*15+100).

However, in the second "uncorrectable" case, the $R^{th}$ and $R+1^{th}$ worst bytes have metrics that are both approximately 10. So by swapping the two bytes, the alternate potential solution will also have a score of 160, identical to that of the original solution. Therefore, it is illustrated that in the correctable case, the difference between the two alternate sets of potential erasures was 90, while in the uncorrectable case, it was near zero.

One downside to this approach is that it can be computationally intensive because the decoder must go through the entire decoding process multiple times. However as illustrated above, the system can determine a worst-case score for the alternate solution set simply by summing the metrics for the {0, 1, . . . , R−1, R+1} worst bytes. Then, the decoding can be done as usual but adding an additional check such that if the score of the winning codeword is greater than some (programmable) threshold below the worst-case alternate score, the codeword could be declared as uncorrectable. In the two cases above, a threshold value of less than 90 would have enabled this check to distinguish between the two.

Another option is based on a lower complexity approach to solving the problem. For example, an exemplary embodiment of this solution can be implemented in firmware with limited hardware support. Essentially, a list of the metrics for the R+1 worst bytes (this is not the same as a list of the R+1 worst bytes) is needed. Fortunately, the metrics for the R+1 worst bytes follows a fairly simple pattern that can be determined in firmware by looking at the ordered list of metrics generated by the Viterbi decoder (which correspond to groups of L bytes). Given the list of the R+1 worst metrics, the system determines the worst-case alternate score from above, chooses an offset, and uses the resulting value as the correctability threshold For example, in the two cases above, the following metrics would be obtained for the R+1 worst bytes:

1 (correctable): 10+10+10+10+10+10+10+10+10+10+10+10+10+10+10+100=250

2 (uncorrectable): 10+10+10+10+10+10+10+10+10+10+10+10+10+10+10+10=160

Then, for example, if a threshold of 45 is chosen (½ of the 90 to give some margin in both directions), the following values can be used as the correctability score for the two cases:

1 (correctable): 205
2 (uncorrectable): 115

Notice that the correctability threshold of the first case is higher than the worst-case score of 160, indicating that the decoder will correct this codeword (which is good, because it is correctable). And conversely, in the second case, the correctability threshold is lower than the worst-case score of 160, so the decoder will not correct the codeword and instead mark it as uncorrectable (which is also good, because it cannot possibly correct the codeword properly).

To generate the list of R+1 metrics needed above, the logic is fairly straightforward. Assume that L*M is approximately equal to R*D so that each RS codeword of size N bytes will contain L/D bytes from each of the past D*N/L metric blocks.

The method for generating the list of R+1 metrics per codeword is then:

```
array sorted_metrics[M+1];
array codeword_metrics[R+1];
``` on each QT Rx done:

```
sorted_metrics[ ] = find M+1 lowest metrics from the last D*N/L
  blocks;
sort sorted_metrics[ ] ascending;
codeword_metrics[0...L/D−1] = sorted_metrics[0]; // worst symbol
metric
codeword_metrics[L/D...2*L/D−1] = sorted_metrics[1];
...
codeword_metrics[INP*L/D...R+1] = sorted_metrics[INP];
CORRECTABILITY THRESHOLD = sum(codeword_metrics[0, 1, ...,
R−1, R+1]) − OFFSET;
```

Another exemplary low complexity solution is to predict when the erasure decoding algorithm will have trouble because more symbols have been affected by an impulse than the current INP level would protect. The firmware would use a simple test to see if the metric was below a threshold to identify a symbol as corrupted.

The implementation for this approach would start by measuring a mean metric for good frames, i.e., those not hit by impulse, and to set the threshold as a percentage of the mean. Then for each frame, count how many metrics are below the threshold. If more than INP frames in the window D*S are below the threshold, it can be assumed that the codewords decoded in this frame will be uncorrectable, and all the data in this frame can be marked as unreliable and requiring retransmission. This is conservative because in cases where not all the bytes in a bad symbol are corrupted the erasure decoder may successfully have corrected some of the codewords.

The mean metric can be calculated at the start of Showtime (user data transmission) and could be updated in real-time, e.g., by a signed difference adaptation loop, so it would track changes in margin over time.

Another exemplary situation is one of white noise only where the number of errors for a given codeword exceeds R/2. In this case, an errors-only decoder is likely (1e-5) to detect the case and flag the codeword as uncorrectable, however an errors+erasures decoder will not. Instead, the errors+erasures decoder will attempt to correct bytes that it treats as erasures, although such bytes are unlikely to be incorrect. That is, they have been chosen as erasures because the algorithm must choose some bytes to be erasures, even though their metrics are actually very close to the non-erasure metrics.

In this case, the exemplary solution above may provide some protection because the $R+1^{th}$ byte is likely to have a metric that is close to the $R^{th}$ byte. Thus it will prevent the design from correcting all 16 erasures. However an additional check can be added.

When operating in a white-noise only scenario, the decoder should not try to correct more than R/2 bytes. To prevent this, the value of the correctability threshold can be set to R/2*the highest metric+1. For example, if R=16 and the metric blocks have reliability values as follows:

200, 205, 210, a value of 8*210+1=1681 can be used as the correctability threshold and stored. Thus any solution which requires more than 8 corrections will not be accepted, e.g., 9*200=1800.

There are cases when the spread of white-noise metrics exceeds 12.5% where this will not guarantee correctness, e.g., metrics=185, 200, 210; 8*210+1=1681; 9*185=1480. However, the probability of a valid codeword resulting from correcting 9 bytes via erasure purely by chance is small (1e-8).

This solution can be layered with any of the previous solutions by simply taking the lower of the two correctability thresholds. This ensures that both criteria must be met before allowing a codeword to be decoded.

Aspects of the invention are thus directed toward Reed-Solomon decoding.

Additional aspects of the invention are directed toward Reed-Solomon erasure decoding with error detection.

Even further aspects of the invention are directed toward Reed-Solomon erasure decoding with error detection for retransmission.

Additional aspects of the invention are directed toward determining whether a code is uncorrectable, and requesting retransmission in the event the code is uncorrectable.

Even further aspects of the invention are related to determining whether retransmission is necessary based on codeword analysis.

Other aspects of the invention are directed toward a decoding and scoring system that utilizes a reliability metric associated with a byte.

Additional aspects relate the ability to correct more bytes utilizing the knowledge of the reliability of the received bytes based on a reliability metric associated with the received bytes.

Even further aspects of the invention relate to utilizing knowledge of the location of an error to correct up to a number of bytes within a codeword.

Even further aspects of the invention relate to utilizing a list of metrics for R+1 worst bytes and determining a worst-case alternate score, choosing an offset and using the resulting value as the correctability threshold.

Additional aspects relate to measuring a mean metric for good frames, and setting a threshold as a percentage of the mean. Then for each frame, counting how many metrics are below the threshold. If more than INP frames in the window are below the threshold, then it can be assumed that the codewords decoded in the frame will be uncorrectable. A retransmission request can then optionally be generated.

Even further aspects of the invention relate to directing a decoder to not try to correct more than R/2 bytes when operating in a white-noise only environment.

Additional aspects relate to when a decoder is operating in a white-noise only environment, setting correctability threshold to R/2*the highest metric+1.

Additional aspects relate to forwarding information, for example in a message, to another entity, such as a management entity, indicating that a codeword(s) was not correctable.

Any of the above aspects and further aspects may be located in a network management system or network operation device that is located inside or outside the network. In particular, aspects that are related to analyzing and/or measuring for improving the detection and diagnosing of problems in a network and/or to optimize or improve the performance of a network may be done in such a device. The network operation or management device that is located inside or outside the network may be managed and/or operated by a user, consumer, service provider or power utility provider or a governmental entity.

These and other features and advantages of this invention are described in, or are apparent from, the following detailed description of the exemplary embodiments.

BRIEF DESCRIPTION OF THE DRAWINGS

The exemplary embodiments of the invention will be described in detail, with reference to the following figures, wherein.

DETAILED DESCRIPTION

The exemplary embodiments of this invention will be described in relation to communications systems, as well as protocols, techniques and methods to perform error detection and correction in a communications environment, such as a DSL or multimode multicarrier communications environment, a home network or an access network, or in general any communications network operating using any communications protocol(s). Examples of such home or access networks include home powerline networks, access powerline networks, home coaxial cable network, access coaxial cable network, home telephone networks and access telephone networks. However, it should be appreciated that in general, the systems, methods, and techniques of this invention will work equally well for other types of communications environments, networks, and/or protocols.

The exemplary systems and methods of this invention will also be described in relation to wired or wireless modems and/or a software and/or a hardware testing module, a telecommunications test device, or the like, such as a DSL modem, an ADSL modem, and xDSL modem, a VDSL modem, a line card, a G.hn transceiver, a MOCA transceiver, a Homeplug® transceiver, a power line modem, a wired or wireless modem, test equipment, a multicarrier transceiver, a wireless wide/local area network system, a satellite communications system, a network-based communications systems, such as an IP, Ethernet or ATM system, a modem equipped with diagnostic capabilities, or the like, or a separate program general purpose computer having a communications device that is capable of operating in conjunction with any one or more of the following communications protocols: CDSL, DSL, ADSL2, ADSL2+, VDSL1, VDSL2, HDSL, DSL Lite, IDSL, RADSL, SDSL, UDSL, MOCA, G.hn, Homeplug, or the like. However, to avoid unnecessarily obscuring the present invention, the following description omits well-known structures, operations and devices that may be shown in block diagram form or are otherwise summarized or known.

For purposes of explanation, numerous details are set forth in order to provide a thorough understanding of the present invention. It should be appreciated however that the present invention may be practiced in a variety of ways beyond the specific details set forth herein. Furthermore, while the exemplary embodiments illustrated herein show various components of this system collocated, it is to be appreciated that various components of the system can be located at distant portions of a distributed network, such as a communications network, node, within a Domain Master, and/or the internet, or within a dedicated secured, unsecured, and/or encrypted system and/or within a network operation or management device that is located inside or outside the network. As an example, a Domain Master can also be used to refer to any device, system or module that manages and/or configures any one or more aspects of the network or communications environment.

Thus, it should be appreciated that the components of the system can be combined into one or more devices, or split between devices, such as a modem, a station, a Domain Master, a network operation or management device, a node or collocated on a particular node of a distributed network, such as a communications network. As will be appreciated from the following description, and for reasons of computational efficiency, the components of the system can be arranged at any location within a distributed network without affecting the operation thereof. For example, the various components can be located in a Domain Master, a node, a domain management device, such as a MIB, a network operation or management device, or some combination thereof. Similarly, one or more of the functional portions of the system could be distributed between a modem and an associated computing device/system, and/or in a dedicated test and/or measurement device.

Furthermore, it should be appreciated that the various links, including the communications channel(s) connecting the elements can be wired or wireless links or any combination thereof, or any other known or later developed element(s) capable of supplying and/or communicating data to and from the connected elements. The term module as used herein can refer to any known or later developed hardware, software, firmware, or combination thereof, that is capable of performing the functionality associated with that element. The terms determine, calculate, and compute and variations thereof, as used herein are used interchangeable and include any type of methodology, process, technique, mathematical operational or protocol. The terms transceiver and modem are also used interchangeably herein. The terms transmitting modem and transmitting transceiver as well as receiving modem and receiving transceiver are also used interchangeably herein. The term DSL is used in this description for any type of xDSL including ADSL1, ADSL2/2+, VDSL, VDSL2, G.inp, HDSL, etc.

The term management interface is related to any type of interface between a management entity and/or technician and a transceiver, such as, a CO-MIB or CPE-MIB as described, for example, in ITU standard G.997.1, which is incorporated herein by reference in its entirety.

Moreover, while some of the exemplary embodiments described herein are directed toward a transmitter portion of a transceiver performing certain functions, this disclosure is intended to include corresponding receiver-side functionality in both the same transceiver and/or another transceiver, and vice versa.

Figure 1:
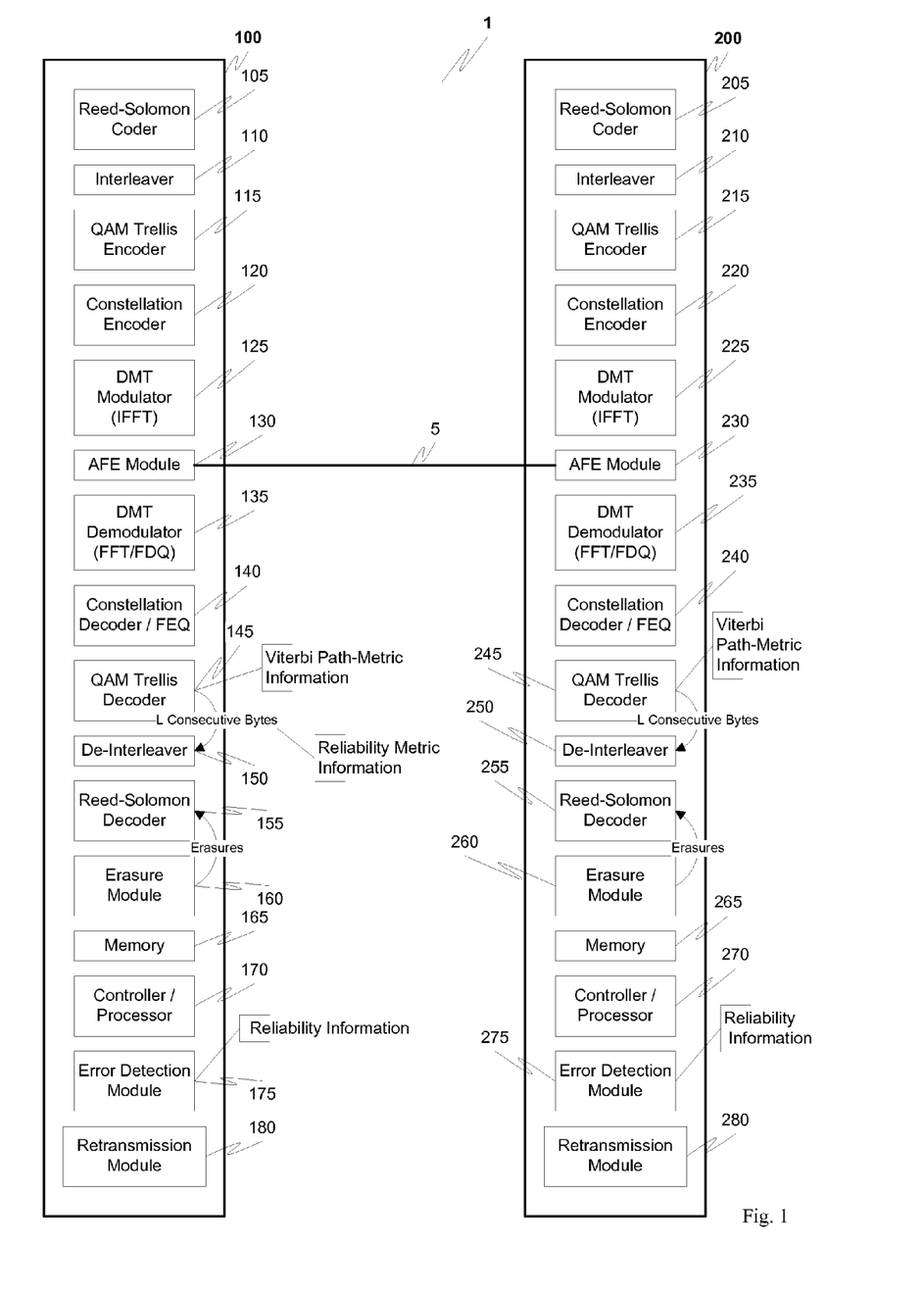
FIG. 1 illustrates an exemplary communications environment according to this invention.

FIG. 1 illustrates an exemplary communications environment 1 according to this invention. In particular, the communications environment 1 includes a modem 100, such as DSL modem connected to a modem 200, such as DSL modem, via a communications channel 5. Each of the modems 100 and 200 include a Reed-Solomon coder (105, 205), an interleaver (110, 210), a QAM (Quadrature Amplitude Modulation Trellis Encoder) (115, 215), a constellation encoder (120, 220), a DMT modulator (125, 225), an analog front end (AFE) module (130, 230), a DMT demodulator (135, 235), a constellation decoder frequency domain equalizer (140, 240), a QAM trellis decoder (145, 245), a de-interleaver (150, 250), a Reed-Solomon decoder (155, 255), an erasure module (160, 260), a memory (165, 265), a processor (170, 270), an error detection module (175, 275), a retransmission module (180, 280), as well as other well-known components.

As discussed, typical "hard-decision decoding" allows the correction of R/2 errored bytes. However, there are a number of deficiencies associated with hard-decision decoding thereby providing room for improvement. For example, utilizing reliability metric information associated with each byte received by the Reed-Solomon decoder (155, 255), more bytes can be corrected. More specifically, utilizing one or more of knowledge about the reliability of a received byte, and the location of errors within a codeword, it is possible to correct up to R bytes. Therefore, in an exemplary codeword that contains 100 bytes, and 16 overhead or redundancy bytes, up to 16 bytes can be corrected capitalizing upon the above knowledge—this can be used to assist with reducing the number of retransmission requests required between modems. In this example, the 16 bytes are "check" bytes or "overhead."

While the following discussion is directed toward the operation of modem 100, it should be appreciated that comparable functionality can be performed in the corresponding modules illustrated in modem 200.

In operation, a signal is received by the analog front end module 130 and forwarded to the DMT modulator 135 for demodulation. The demodulated signal is then decoded by the constellation decoder 140 and trellis decoded by the QAM trellis decoder 145. The QAM trellis decoder 145 outputs L consecutive bytes to the deinterleaver 150 with each of the L consecutive bytes including an associated reliability metric. The L consecutive bytes are then forward to the deinterleaver 150 which spreads out the errors by deinterleaving the bytes before being sent to the Reed-Solomon decoder 155.

In general the Reed-Solomon decoder 155, cooperating with the erasure module 160, memory 165, processor 170, and error detection module 175, operates on the bytes for each codeword as follows for a first exemplary embodiment.

First, the error detection module 175 sorts the reliability metrics for each byte and chooses the R worst bytes as potential erasures that could be erased under the direction of the erasure module 160.

The processor 170, cooperating with memory 165 then determines the R/2+1 potential codewords that result from correcting all of the R worst bytes and no errors, next determining the R−2 worst bytes and one error, and so on. These solutions are then scored by summing the reliability metrics for each byte that was incorrect in that particular solution.

The potential codeword with the lowest score is the best, and can be chosen as the candidate solution codeword. If the candidate solution has a score less than a programmable "correctablility" threshold, the codeword can be decoded. Otherwise, the error detection module 175 can declare the codeword as uncorrectable, and optionally coordinate with the retransmission module 180 to request retransmission of that codeword from the other modem.

While the exemplary embodiments herein are directed toward valuations on a codeword-by-codeword basis, it should be appreciated the basic steps can be extended to include comparisons of multiple codewords. For example, if it is determined that a codeword is uncorrectable, and retransmission of that codeword is requested, the retransmitted codeword can be evaluated on a stand-alone basis to determine whether it is decodable. As an alternative, or in addition, the original codeword can be compared to one or more retransmitted codewords and the score of the original codeword and the one or more additional retransmitted codewords compared or combined, with the modem selecting the codeword with the lowest score as the best candidate solution. For example, the reliability metrics for bytes in a retransmitted codeword could be combined or compared with the reliability metrics for bytes of the originally transmitted codeword. In one exemplary embodiment, the reliability metrics of at least one byte of a retransmitted codeword is added to the reliability metric of at least one byte of the original codeword. In another exemplary embodiment, the reliability metrics of at least one byte of a retransmitted codeword is compared to the reliability metric of at least one byte of the original codeword and the greater or lesser of the two is selected.

As another example, in the instance of a codeword needing retransmitting, the original codeword, and one or more additional codewords can be buffered to facilitate this determination. Associated with each codeword would then be a score corresponding to that codeword's best candidate solution.

As discussed, and in accordance with one exemplary embodiment, rather than choosing a hard-coded erasure threshold, multiple solutions can be determined for each codeword. The best decode is the one that minimizes an objective function that depends on the reliability of the bytes corrected in that solution.

Therefore, upon receipt of a signal by the AFE module 130, which is demodulated by the DMT demodulator 135 and decoded by constellation decoder 140, the QAM trellis decoder 145 assigns to each byte in each codeword the reliability metric. As discussed, this reliability metric has an impact on whether the byte should be erased in accordance with a direction from the erasure module 160. Once the L consecutive bytes have been received by the deinterleaver 150 and the Reed-Solomon decoder 155, the Reed-Solomon decoder 155 cooperating with the processor 170, memory 165 and error detection module 175 sorts the reliability metrics for each byte and chooses the R worst bytes as potential erasures.

Next, the R/2+1 potential codewords that result from correcting all of the R worst bytes and no errors, the R−2 worst bytes and one error, and so on, are determined. The R/2+1 solutions are scored by summing the reliability metrics for each byte that was incorrect for that particular solution. The potential codeword with the lowest score is the best, and is determined and identified as the candidate solution. If the candidate solution has a score less than a correctability threshold, the codeword is decoded by the Reed-Solomon decoder 155. Otherwise, the codeword is declared as uncorrectable by the error detection module 175 with retransmission module 180 optionally requesting retransmission of that uncorrectable codeword from, for example, modem 200.

In the situation where the impulse burst length is greater than an impulse protection value, the Reed-Solomon decoder 155 can correct any burst of consecutive errors such that $L*M<=R*D$.

Therefore, provided $L*M<=R*D$ the error detection module 175 is able to determine that the errors have very low metrics and, again with the cooperation of processor 170 and memory 165, it is determined which errored bytes should be chosen as potential erasures. Once the error detection module 175 determines which error bytes should be erased, the erasure module 160 forwards the erasure directive to the Reed-Solomon decoder 155 and erases the errored bytes thereby allowing the received codeword to be correctly decoded.

However, should $L*M>R*D$, the errors have very high metrics in which case the error detection module 175 can randomly choose errored bytes as potential erasers. In this situation, the codeword is probably not correctable in which case the retransmission module 180 can request retransmission of the uncorrectable codeword from modem 200.

As discussed, one problem with the two above cases is that the same score can be obtained for the first case where the codeword was corrected properly. Thus, there may be situations that exist where no setting of the correctability threshold can distinguish between the two cases.

Accordingly, a first exemplary solution performs the decode and scoring steps twice, once using the R worst bytes as discussed above, and then again, utilizing a modified solution set obtained by swapping the $R^{th}$ and $R+1^{th}$ worst bytes. These steps are performed by the same modules with the error detection module 175, cooperating with the processor 170 and memory 165 and determining if the swapped solution set has a score that is "sufficiently different" from the decode that used the R worst bytes. If there isn't a sufficient difference between the two sets, then the retransmission module 180 can request retransmission of that uncorrectable codeword.

In accordance with an additional exemplary embodiment, the erasure module 160 and the error detection module 170 are in possession of a list of metrics for the R+1 worst bytes, and with the R+1 worst metrics, it can be determined what is the worst-case alternate score utilizing the above technique, choosing an offset by the processor 170, and using the resulting value as the correctability threshold. This correctability threshold can then be utilized in determining whether or not the retransmission module 180 should ask for retransmission of an uncorrectable codeword.

In accordance with another exemplary embodiment, a technique is provided that allows a system to predict when the erasure decoding will have trouble because more symbols have been affected by an impulse than the current INP level could protect. In accordance with this exemplary embodiment, the error detection module 175 measures a mean metric for good frames, e.g., those not hidden by impulse, and sets the correctability threshold as a percentage of the mean. The error detection module 175, cooperating with processor 170 and memory 165, for each frame, counts how many metrics are below the threshold. If more that INP frames in the window D*S are below the threshold, the error detection module 175 concludes that the codewords decoded this frame will be uncorrectable, in which the case the error detection module 175 marks all the data in the frame as unreliable and optionally requiring retransmission in cooperation with the retransmission module 180.

This mean metric can be determined at the start of Showtime and could be updated in real-time such that, for example, changes in margin can be tracked over time. As with the other scenarios, when it is determined that data is unreliable and requires retransmission, the retransmission requests can be handled with the cooperation of the retransmission module 180 such that the frame (or codeword) can be retransmitted.

In accordance with another exemplary embodiment, a solution is provided where there is white noise and where the number of errors for a given codeword exceeds R/2. When operating in this white-noise type environment, the Reed-Solomon decoder 155 should not try to correct more than R/2 bytes. Thus, when it is determined that the modem is operating in a white-noise only scenario, the error detection module 175 sets the correctability threshold to R/2*the highest metric+1. This solution can be utilized in combination with any of the other solutions by taking the lower(est) of the correctability thresholds, thus ensuring that both criteria are met before allowing a codeword to be decoded.

Figure 3:
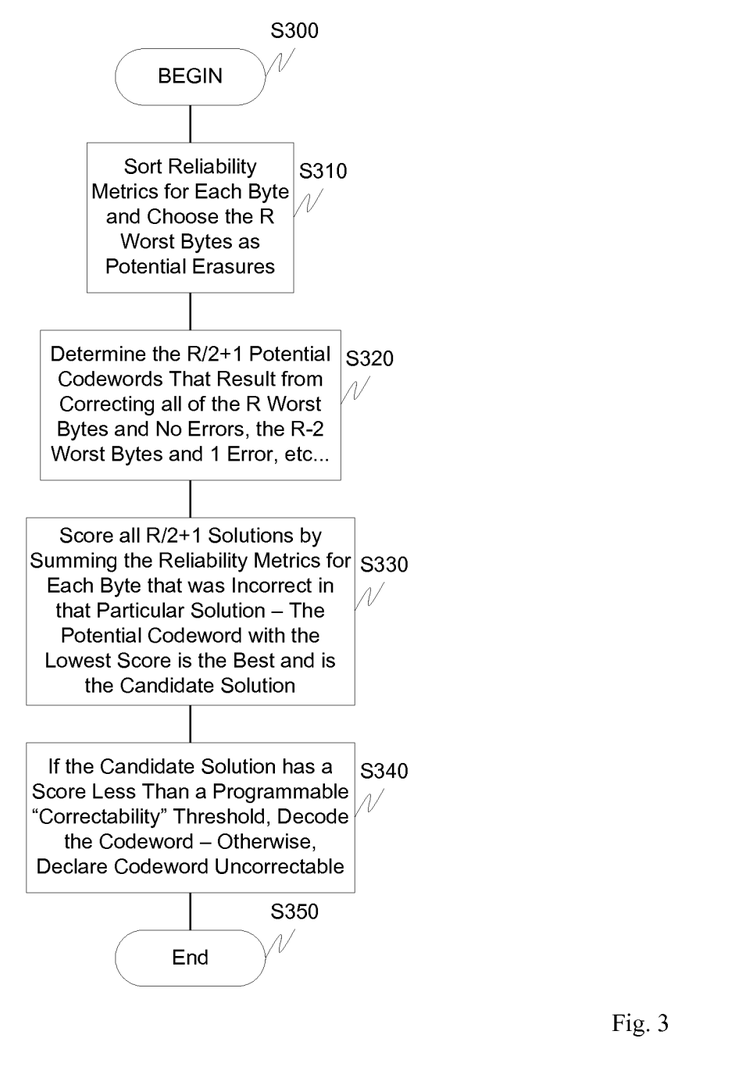
FIG. 3 is a flowchart that outlines an exemplary method of operation of a decoder on an RS codeword according to this invention.

FIG. 3 outlines an exemplary method for Reed-Solomon erasure decoding. In particular, control begins in step S300 and continues to step S310. In step S310, the reliability metrics for each byte are sorted and chosen such that the R worst bytes are identified as potential erasures. Next, in step S320, the R/2+1 potential codewords that result in correcting all of the R worst bytes and no errors, the R−2 worst bytes and one error, etc., are determined. Then, in step S330, all of the R/2+1 solutions are scored by summing the reliability metrics for each byte that was incorrect in that particular solution, thus resulting in the potential codeword with the lowest score being the best and candidate solution. Control then continues to step S340.

In step S340, if the candidate solution has score less than a correctability threshold, the codeword is decoded. Otherwise, the codeword can be declared as uncorrectable with a retransmission request initiated. Control then continues to step S350 where the control sequence ends.

Figure 4:
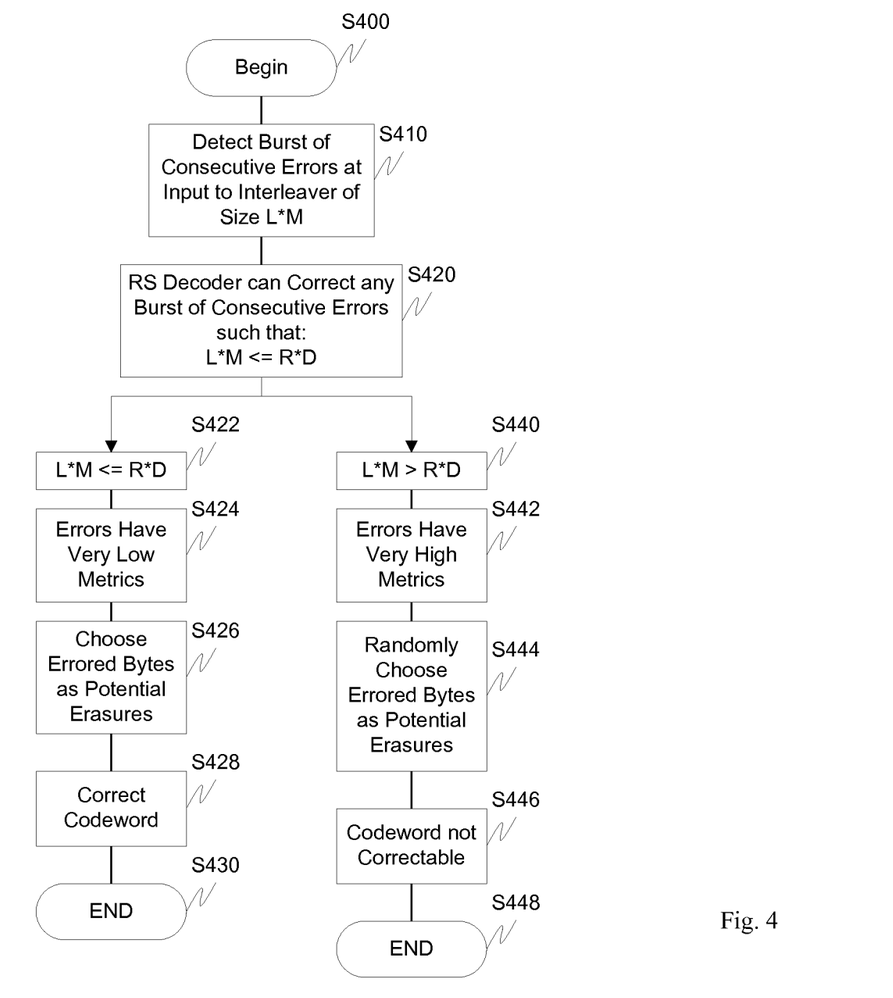
FIG. 4 is a flowchart illustrating a first exemplary method for error correction according to this invention.

FIG. 4 is a flowchart outlining an exemplary method for determining whether a codeword is correctable. In particular, control begins in step S400 and continues to step S410. In step S410, a burst of consecutive errors are detected at an input to an interleaver. Next, in step S420, it is assumed that the Reed-Solomon decoder can correct bursts of consecutive error such that L*M<=R*D. Two scenarios are then presented where L*M<=R*D, with control jumping to step S422. Otherwise, when L*M>R*D, control jumps to step S440.

In step S424, errored bytes have very low metrics. Then, in step S426, errored bytes are chosen as potential erasures with, in step 428, the codeword being corrected. Control then continues to S430 where the control sequence ends.

In the situation where L*M<R*D, the errors have very high metrics in step S422, in which case, in step S444, the errored bytes are randomly chosen as potential erasures. This results in step S446 of the codeword not being correctable with control continuing to step S448 where the control sequence ends. As will be appreciated, and in any situation where the codeword is not correctable, a retransmission request can be initiated to request retransmission of the uncorrectable codeword.

Figure 5:
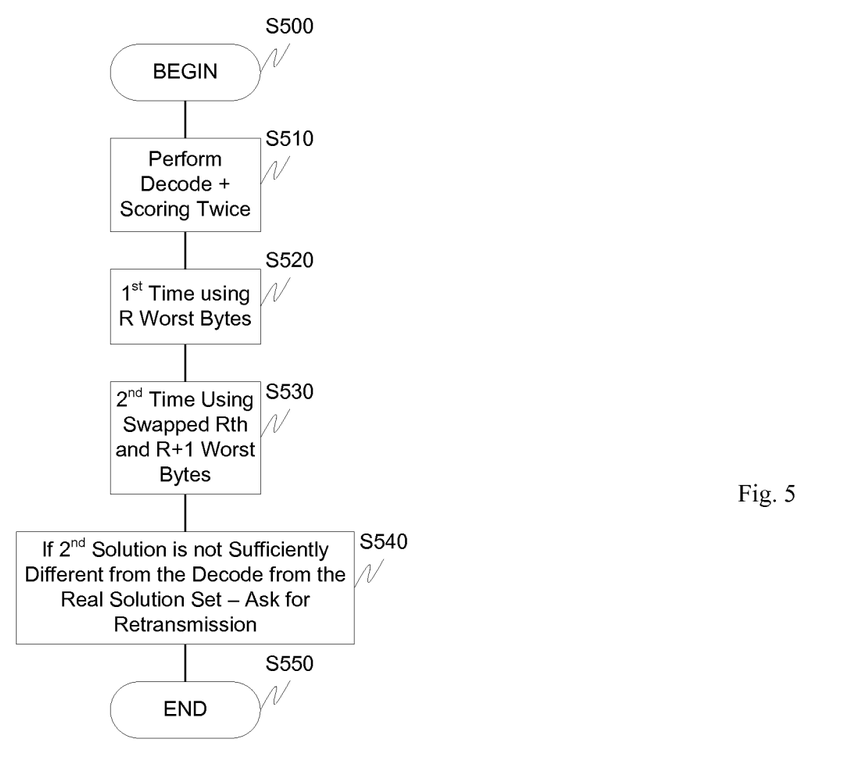
FIG. 5 is a flowchart illustrating another exemplary method for determining whether retransmissions are required according to this invention.

FIG. 5 illustrates another exemplary embodiment where the decoding and scoring steps are performed twice. Specifically, control begins in step S500 and continues to step S510. In step S510, the decode and scoring steps begin to be performed twice, once using the R worst bytes in step S520, and then again, utilizing a modified solution set obtained by swapping the $R^{th}$ and $R+1^{th}$ worst bytes in step S530. In step S540, it is determined whether the swapped solution set has a score that is "sufficiently different" from the decode that used the R worst bytes. If there isn't a sufficient difference between the two sets, then retransmission can be requested for the uncorrectable codeword.

Figure 6:
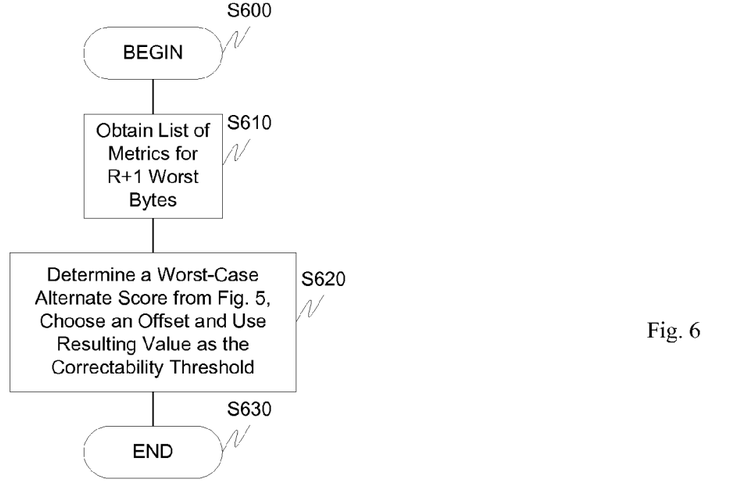
FIG. 6 is a flowchart outlining an exemplary method for utilizing an offset according to this invention.

FIG. 6 is a flowchart outlining an exemplary method utilizing a list of metrics and an offset to determine a correctability threshold. In particular, control begins in step S600 and continues to step S610. In step S610, a list of metrics for the R+1 worst bytes are obtained. Next, in step S620, a worst case alternate score is determined from FIG. 5 and an offset chosen and the resulting value used as the correctability threshold. Control then continues to step S630 where the control sequence ends.

Figure 7:
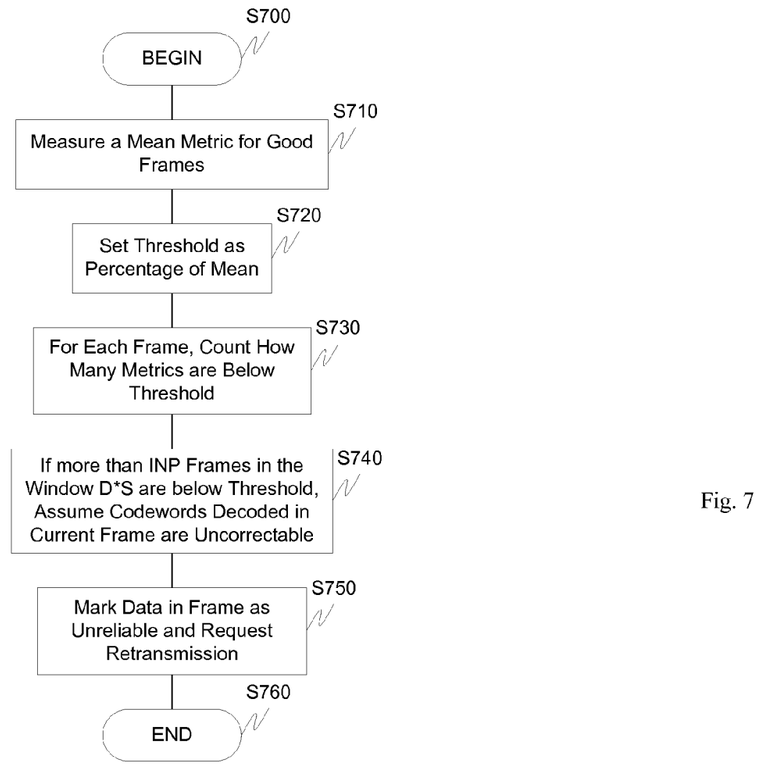
FIG. 7 is a flowchart outlining an exemplary method for predicting when an erasure decoding solution will have trouble because more symbols have affected by an impulse than the an INP level would protect.

FIG. 7 is a flowchart outlining another exemplary method for determining whether codewords are correctable. In particular, control begins in step S700 and continues to step S710. In step S710, a mean metric for good frames is measured. Next, in step S720, the correctability threshold is set as a percentage of the mean. Then, in step S730, and for each frame, the number of metrics below the threshold are counted. Control then continues to S740.

In step S740, if more than INP frames in the window D*S are below the threshold, it is assumed that the codewords decoded in the current frame are uncorrectable. Next, in step S750, data in the frame is marked as unreliable with an optional retransmission request initiated. Control then continues to step S760 where the control sequence ends.

Figure 8:
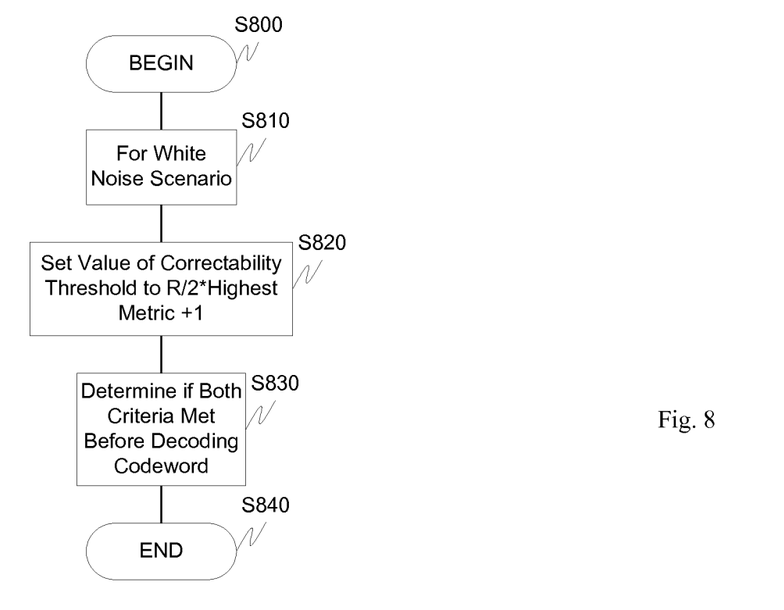
FIG. 8 is a flowchart outlining an exemplary white-noise solution according to this invention.

FIG. 8 is flowchart outlining an exemplary method for determining the decodability of codewords in a white-noise environment. In particular, control begins in step S800 and continues to step S810. In the white-noise environment, the correctability threshold is set to R/2*the highest metric+1 in step S820. Next, in step S830, it is determined whether both criteria have been met before decoding a codeword. More specifically, this solution is utilized with one or more of the previous solutions by the solution taking the lower of the two correctability thresholds. This ensures that both criteria must be met before allowing a codeword to be decoded. Control then continues to step S840 where the control sequence ends.

As used herein the terms network and domain have the same meaning and are used interchangeably. Also, the terms receiver, receiving node and receiving transceiver have the same meaning and are used interchangeably. Similarly, the terms transmitter, transmitting node and transmitting transceiver have the same meaning and are used interchangeably. The terms transceiver and modem also have the same meaning and are used interchangeably. While the term home network has been used in this description, the description is not limited to home networks but in fact applies also to any network, such as enterprise networks, business networks, or any network with a plurality of connected nodes. The terms time slots, time periods and time interval also have the same meaning and can be used interchangeably. While the above-described methods and systems can be described with respect to a port (or endpoint) in a network, they can also be implemented in a dedicated module such as a test or network optimization module. This dedicated module could be plugged into the network and act as a Domain Master or with the cooperation of the Domain Master could initiate the various measurement techniques, gather the measurements from the port(s) in the network, analyze the measurements and use the measured information to detect and diagnose problems in the network and/or to optimize or improve the performance of a network (as described above).

The above-described methods and systems and can be implemented in a software module, a software and/or hardware testing module, a telecommunications test device, a DSL modem, an ADSL modem, an xDSL modem, a VDSL modem, a linecard, a G.hn transceiver, a MOCA transceiver, a Homeplug transceiver, a powerline modem, a wired or wireless modem, test equipment, a multicarrier transceiver, a wired and/or wireless wide/local area network system, a satellite communication system, network-based communication systems, such as an IP, Ethernet or ATM system, a modem equipped with diagnostic capabilities, or the like, or on a separate programmed general purpose computer having a communications device or in conjunction with any of the following communications protocols: CDSL, ADSL2, ADSL2+, VDSL1, VDSL2, HDSL, DSL Lite, IDSL, RADSL, SDSL, UDSL, MOCA, G.hn, Homeplug® or the like.

Additionally, the systems, methods and protocols of this invention can be implemented on a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable means, or the like. In general, any device capable of implementing a state machine that is in turn capable of implementing the methodology illustrated herein can be used to implement the various communication/measurement methods, protocols and techniques according to this invention.

Furthermore, the disclosed methods may be readily implemented in software stored on a non-transitory computer-readable storage media using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized. The communication systems, methods and protocols illustrated herein can be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed methods may be readily implemented in software that can be stored on a computer-readable storage medium, executed on programmed general-purpose computer with the cooperation of a controller and memory, a special purpose computer, a microprocessor, or the like. The systems and methods of this invention can be implemented as program embedded on personal computer such as an applet, JAVA® or CGI script, as a resource residing on a server or computer workstation, as a routine embedded in a dedicated communication system or system component, or the like. The system can also be implemented by physically incorporating the system and/or method into a software and/or hardware system, such as the hardware and software systems of a test/modem device.

While the invention is described in terms of exemplary embodiments, it should be appreciated that individual aspects of the invention could be separately claimed and one or more of the features of the various embodiments can be combined.

While the exemplary embodiments illustrated herein discuss the various components collocated, it is to be appreciated that the various components of the system can be located a distant portions of a distributed network, such as a telecommunications network and/or the Internet or within a dedicated communications network. Thus, it should be appreciated that the components of the system can be combined into one or more devices or collocated on a particular node of a distributed network, such as a telecommunications network. As will be appreciated from the following description, and for reasons of computational efficiency, the components of the communications network can be arranged at any location within the distributed network without affecting the operation of the system.

It is therefore apparent that there has been provided, in accordance with the present invention, systems and methods for erasure decoding. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A method in a communications device comprising:
receiving, at a transceiver, a codeword;
determining whether the codeword is decodable; and
when the codeword is not decodable, requesting retransmission of the non-decodable codeword.

2. The method of claim 1, further comprising determining at least one reliability metric.

3. The method of claim 1, further comprising determining at least one erasure.

4. The method of claim 1, further comprising determining at least one correctability threshold.

5. A communication device comprising:
a receiver operable to receive a codeword;
a decoder operable to determine whether a codeword is decodable; and
a retransmission module, operable to request retransmission of the non-decodable codeword when the codeword is not decodable.

6. The device of claim 5, wherein the decoder is further operable to determine at least one reliability metric.

7. The device of claim 5, wherein the decoder is further operable to determine at least one erasure.

8. The device of claim 5, wherein the decoder is further operable to determine at least one correctability threshold.

* * * * *